United States Patent [19]

Kobayashi et al.

[11] 4,405,436

[45] Sep. 20, 1983

[54] SPUTTERING APPARATUS

[75] Inventors: Haruhiro Kobayashi, Zushi; Hidefumi Funaki, Hamura; Takehiro Sakurai, Hino, all of Japan

[73] Assignee: Anelva Corporation, Fuchu, Japan

[21] Appl. No.: 439,044

[22] Filed: Nov. 4, 1982

[30] Foreign Application Priority Data

Jun. 16, 1982 [JP] Japan ................................ 57-102260

[51] Int. Cl.³ .............................................. C23C 15/00
[52] U.S. Cl. ............................... 204/298; 204/192 R; 204/192 M
[58] Field of Search ................ 204/298, 192 R, 192 M

[56] References Cited

U.S. PATENT DOCUMENTS

| | | | |
|---|---|---|---|
| 3,117,065 | 1/1964 | Wootten | 204/192 M |
| 3,838,031 | 9/1974 | Snaper | 204/298 |
| 3,840,451 | 10/1974 | Golyanov et al. | 204/298 |
| 4,282,083 | 8/1981 | Kertesz et al. | 204/298 |
| 4,299,678 | 11/1981 | Meckel | 204/192 M |
| 4,324,631 | 4/1982 | Meckel et al. | 204/192 M |
| 4,370,217 | 1/1983 | Funaki | 204/192 M |

*Primary Examiner*—Arthur P. Demers
*Attorney, Agent, or Firm*—Charles E. Pfund

[57] ABSTRACT

In a sputtering apparatus of the type wherein a cathode including a target made of ferromagnetic material and a substrate to be sputtered are disposed in an evacuated vessel in a spaced opposing relationship so as to sputter the target with ions to form thin magnetic films on said substrate, there are provided a magnet disposed on a backing plate, a shield covering surfaces of the magnet facing the substrate, the shield being made of the same or similar material as the target, and a metal block disposed to surround the magnet in contact with the shield and the backing plate. A passage for passing cooling water to cool the above components is further provided in the cathode.

12 Claims, 10 Drawing Figures

SPUTTERING APPARATUS

BACKGROUND OF THE INVENTION

This invention relates to sputtering apparatus, and more particularly a magnetron type sputtering apparatus suitable to use ferromagnetic material as a target.

In the sputtering apparatus of this type, negative voltage is impressed upon a target disposed at the cathode under a pressure of $10^{-1}$ to $10^{-5}$ Torr to emit electrons from the target and the electrons are caused to whirl about the target so as to ionize gas molecules. The resulting ions are caused to collide against the target surface to sputter the target material so as to form a metal film on a substrate. In such sputtering apparatus, for the purpose of increasing the productivity of the film by improving the deposition rate it has been proposed to use magnetic field having a component parallel to the target surface in front of the target. In most cases, magnetic pole pairs are disposed on the rear side of the target so as to utilize the magnetic field reaching the front surface of the target therethrough.

However, where the target is made of ferromagnetic material, the magnetic poles on the rear side of the target are difficult to have an influence on the front side. For this reason, for the purpose of utilizing ferromagnetic material for sputtering, various proposals have been made. According to one proposal the magnet poles are disposed in front of the target. With this construction, however, there is a porblem that the pole surface may be sputterred. So poles should be covered by a material having the same or similar composition as the target.

In the sputtering apparatus with its magnetic poles covered by the shield, not only the sputtering speed of ferromagnetic material can be improved to some extent but also sputtering of the magnetic poles themselve can be prevented. However, when the sputtering deposition rate is increased further the temperature of the magnetic poles rises, thus degrading the characteristic.

SUMMARY OF THE INVENTION

Accordingly it is an object of this invention to provide an improved sputtering apparatus of the type wherein magnetic poles are disposed in front of a target and the front surfaces of the poles are covered by a material having the same or similar composition as the target, and in which temperature rise of the poles and shields are prevented thereby enabling to increase the sputtering rate of ferromagnetic material.

These and further objects can be accomplished according to this invention by providing shields on the upper surfaces of the magnetic poles disposed in front of or on the target and by disposing metal blocks made of material such as copper, stainless steel, aluminum or thin feromagnetic material around the magnetic poles.

According to this invention there is provided sputtering apparatus of the type wherein a cathode including a target made of magnetic material and substrate to be sputtered are disposed in an evacuated vessel in a spaced opposing relationship so as to sputter the target with ions to form thin magnetic films on the substrate, characterized in that there are provided at least two magnets disposed on the target, shields covering surfaces of the magnets facing the substrate, the shields being made of the same or similar material as the target, and blocks made of material such as copper, stainless steel, aluminum or thin feromagnetic material and disposed surrounding the magnets, and a backing plate supporting the magnets.

BRIEF DESCRIPTION OF THE DRAWINGS

Throughout the drawings similar or identical parts are designated by the same reference numerals, and those having the same performance are designated by the same reference numerals with appropriate suffixes.

DESCRIPTION OF THE PREFERRED EMBODIMENT

Figure 1:
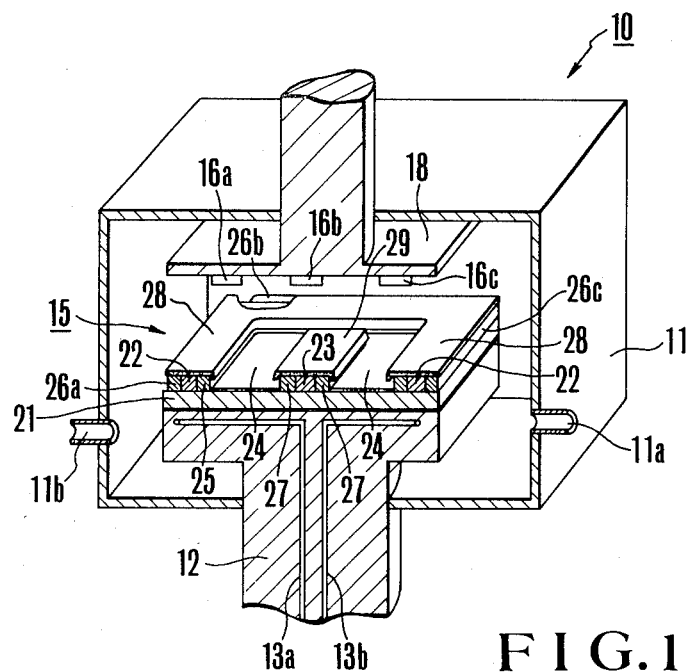
FIG. 1 is a perspective view, partly broken away, showing one embodiment of the sputtering apparatus according to this invention.

In the embodiment shown in FIG. 1, a letter T shaped cathode supporter 12 supporting a cathode is contained in an evacuated vessel 11 is of the sputter apparatus 10. The cathode supporter 12 is formed with cooling water passages 13a and 13b for passing cooling water from outside source and a wiring conduit, not shown, accommodating wirings necessary for sputtering.

A cathode assembly 15 to be described hereunder in detail is mounted on the cathode supporter 12. A substrate holder 18 adapted to support substrates 16a, 16b, 16c to be sputtered polyester films for example, is disposed above the target assembly 15 with a suitable spacing. The vessel 11 is connected to an evacuation pump, not shown, through a pipe 11a and to an argon gas bomb, not shown, through a pipe 11b for forming ions for causing sputtering.

The cathode assembly 15 characterizing the invention is constructed as follows. More particularly, the cathode assembly 15 comprises a backing plate 21 made of soft ferromagnetic material. The backing plate 21 has a rectangular configuration, for example, and is directly mounted on the cathode supporter 12, and an annular permanent magnet 22 is disposed near the periphery of the backing plate 21. At the center of the backing plate 21 is disposed a permanent magnet 23. These magnets 22 and 23 are magnetized such that they will have different polarities in the vertical direction in the drawing. Sheet shaped targets 24 made of ferromagnetic material such as permalloy are disposed on the surface of the backing plate 21 between the blocks 25 and 27. Blocks 25, 26a, 26b and 26c, for example, are made of metal material such as copper, stainless steel, aluminum or thin ferromagnetic material. An annular block 25 is disposed along the inner side of the annular magnet 22, and a plurality of spaced apart pillar shaped blocks 26a, 26b and 26c are disposed on the outside of the magnet 22. A ring shaped block 27 is provided to surround the central magnet 23.

An annular shields 28 is applied to cover the upper surfaces of both pole surfaces of the magnet 22 and the blocks 25 and 26. The shield 28 is made of the same material as the targets 24, permalloy for example. A shield 29 also made of permalloy is mounted to cover the pole surface of the central magnet 23 and the block 27. Since the purpose of the magnets 22, 23 is to form magnetic field parallel with the targets in front of them, the magnets 22 and 23 should be polarized in the opposite directions. The backing plate 21 may be cooled with water.

After evacuating the vessel 11 with the vacuum pump to a pressure of $1 \times 10^{-6}$ Torr for example, argon gas is introduced into the vessel to a pressure of $1 \times 10^{-3}$ Torr to $1 \times 10^{-2}$ Torr, and a high frequency or DC power is applied across the cathode and the evacuated vessel 11 to make the cathode negative potential that is cathode fall so as to create glow discharge between the cathode and the vessel 11. Since the lines of magnetic force cross perpendicularly with the electric field caused in the cathode fall, electrons in a plasma undergo magnetron motion to increase the chance of collision with argon atoms thus increasing the efficiency of ionization. Accordingly, the density of the plasma increases so that a large number of argon ions collide against the surfaces of the targets 24 and the shields 28, 29 whereby sputtered metal particles deposite on the substrate 16 so as to have high deposition rate.

The heat generated by target and shields 28 and 29 during the sputtering operation is rapidly removed through the backing plate 21, cathode supporter 12 and flowing water in pipe 13. By intimately contacting shields 28 and 29 against blocks 25, 26 and 27 and blocks 25, 26 and 27 against backing plate 21 and cathode supporter 12, the resistance against heat transfer can be reduced greatly thus improving the cooling effect. Accordingly, it is possible to prevent overheating of the permanent magnets which results in the degradation of the sputtering operation which has been inevitable in the prior art construction.

Figure 2:
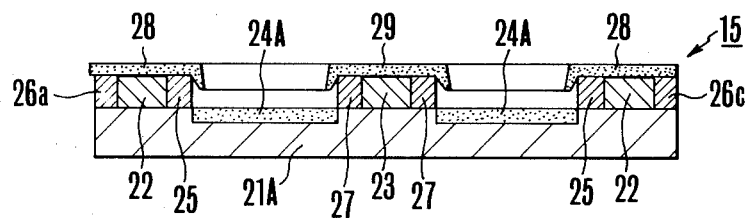
FIGS. 2 and 3 are cross sectional views showing modified target assemblies.

FIG. 2 shows a modification of the cathode assembly. In this modification, the targets 24A are embedded in the backing plate 21 provided with a cooling mechanism, and on the other portions of the backing plate 21A are mounted an annular magnet 22, annular blocks 25, 26a and 26c, a central magnet 23, and a block 27 surrounding the magnet 23. The shields 28 and 29 covering the magnets 22, 23 and the blocks 25, 26, 27 are made of the same or similar material as the targets.

Figure 3:
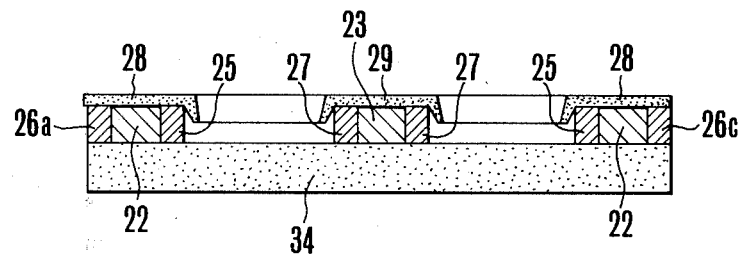

FIG. 3 shows still another modification of this invention in which a plate shaped target 34 serving a backing plate with a cooling mechanism (corresponding to the backing plate 21 shown in FIG. 2), and other elements are identical to those shown in FIG. 2. In this embodiment, since the target 34 sets as the backing plate, the construction is simplified and the cooling effect is enhanced.

Figure 4:
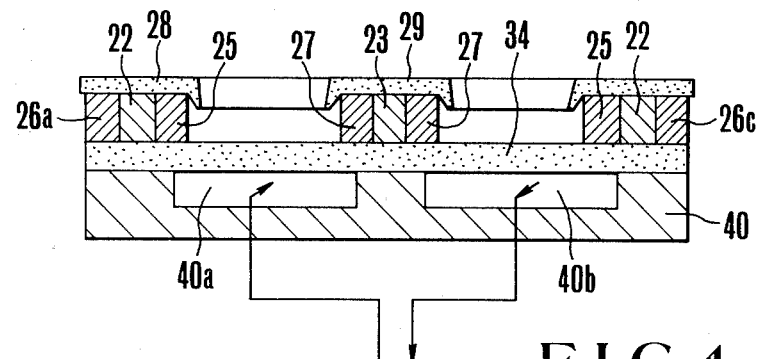
FIG. 4 is a cross sectional view showing a modification of FIG. 3 in which a letter E type yoke is disposed beneath the target support.

FIG. 4 illustrates still another embodiment of this invention which differs from that shown in FIG. 3 in that a letter E shaped yoke 40 made of a soft ferromagnetic material is disposed beneath the target 34 made of ferromagnetic material. The central projection of the yoke 40 is disposed to oppose the central magnet 23 while the projections at both ends are disposed to oppose the annular magnet 22. The recesses 40a and 40b of the yoke 40 form passages for passing cooling water in a direction shown by arrows so as to cool the target 34 and the yoke 40.

Also with this construction, the heat generated by the shields 28 and 29 is transferred to the target 34 through blocks 25, 26 and 27 and removed by flowing water in the yoke 40.

Figure 5:
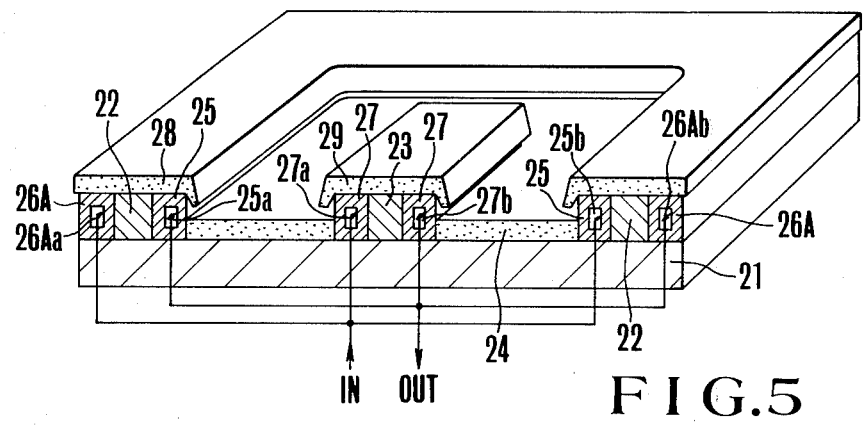
FIG. 5 is a perspective view, partly in section, showing a modified embodiment of the sputtering apparatus of this invention in which cooling water passages are provided through metal blocks.

FIG. 5 shows yet another modification of this invention. On the upper surface of a backing plate made of ferromagnetic material 21 are mounted an annular magnet 22 near the periphery, a central magnet 23, annular metal blocks 25 and 26A extending along the both sides of the magnet 22 and made of a metal having a high heat conductivity, a metal block 27 surrounding the magnet 23, and targets made of ferromagnetic material, permalloy for example. Magnets 22 and 23 are magnetized in the opposite directions in the vertical direction. A shield 28 made of the same or similar material as the targets 24 is mounted on the surfaces of the magnet 22 and the metal blocks 25 and 26, whereas a shield 29 also made of the same or similar material as the targets 24 is mounted on the surfaces of the magnet 23 and the metal block 27. At the centers of the metal blocks 25, 26A and 27 are formed water passages 25a, 26b, 26Aa, 26Ab, 27a and 27b respectively. As diagrammatically shown in FIG. 5, these water passages are connected to a common inlet port IN and a common outlet port OUT. These inlet port IN and outlet port OUT are respectively connected to the water passages 13a and 13b of the cathode supporter 12 shown in FIG. 1 so as to pass the cooling water.

With this construction, since the magnet 22, shields 28 and 29, magnet 23 and backing plate 21 form a magnetic flux circuit, so that air gaps between the shields 28 and 29 has a proper magnetic flux. The magnetic fields in these air gaps are formed in parallel with the target surfaces in front thereof. During the sputtering operation shields 28 and 29 generate heat, and the heat is removed by the cooling water flowing through the water passages 25a, 25b, 26Aa, 26Ab, 27a and 27b and absorbed by metal blocks 25, 26 and 27 having a high heat conductivity so that the temperature of the magnets 22 and 23 does not exceed a predetermined value. This enables to apply a higher power to the targets 24 so as to increase the deposition rate.

The provision of metal blocks is effective to remove heat therethrough. Consequently, the deposition rate can be increased more than 3 times than a case not provided with the metal blocks where water passages are provided through the metal blocks as in this embodiment, the deposition rate can be increased further. Still other embodiments of this invention will be described with reference to FIGS. 6 through 10.

Figure 6:
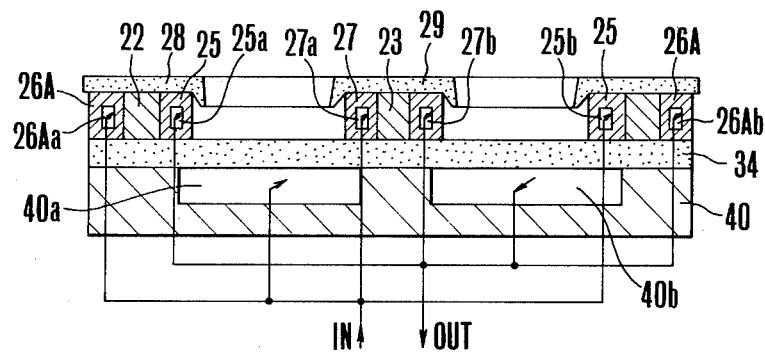
FIGS. 6 through 10 are cross sectional views showing other modifications of the target assembly having cooling water passages.

In the embodiment shown in FIG. 6 the backing plate 21 shown in FIG. 5 is replaced by a target 34 of the same size, and a letter E shaped yoke 40 made of soft ferromagnetic material is disposed beneath the target 34. Independent water passages 40a are formed between the yoke 40 and the rear surface of the target 34. Even when the target 34 wear as a result of sputtering, since the yoke 40 forms a magnetic flux circuit, the magnetic characteristic does not change, thus maintaining constant the sputtering characteristics.

Figure 7:
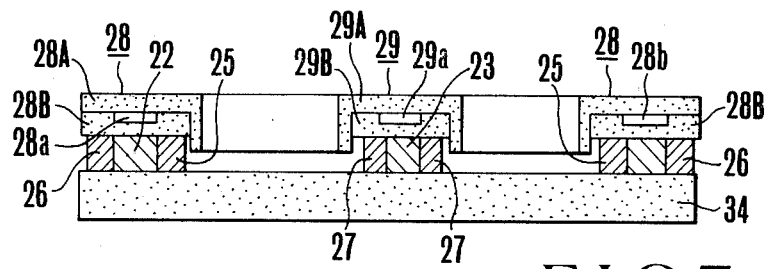

In the embodiment shown in FIG. 7 metal blocks and magnets are mounted on a target plate. In this case, each shield 28 is constituted by a combination of member 28A and a member 28B, the members 28B being formed with water passages 28a and 28b. Cooling water flows from the passage 29a to the passage 28b. In the same manner, a shield 29 is constituted by a member 29A and a recessed member 29B to form a water passage 29a which is connected to an inlet port and a outlet port, not shown. The metal blocks 25, 26A and 27 are not formed with any water passage. In this embodiment, since water passages are formed in the shields 28 and 29 which generate heat, the efficiency of heat absorption can be improved.

Figure 8:
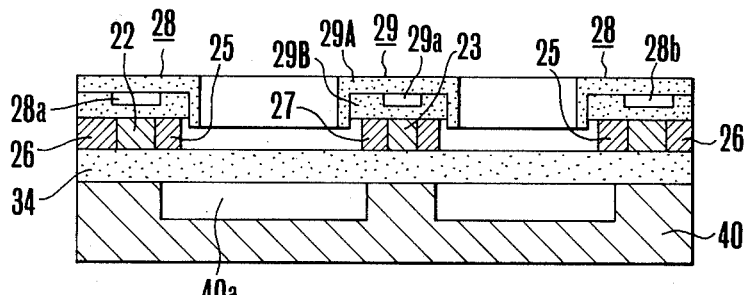

In the embodiment shown in FIG. 8, the yoke 40 shown in FIG. 6 is combined with the embodiment shown in FIG. 6 to obtain the advantages of both embodiments.

Figure 9:
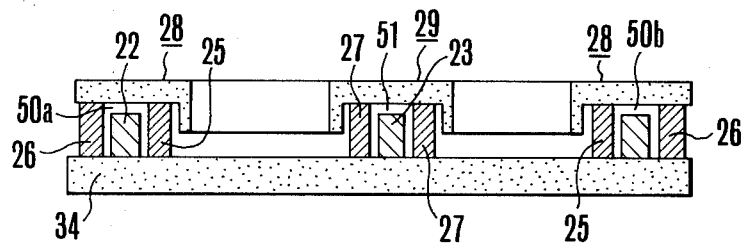

In the embodiment shown in FIG. 9, metal blocks 25 and 26 have larger inner dimensions than the outer dimension of the magnet 22 and the heights of the metal blocks 25 and 26 are larger than the height of the magnet 22 so as to form gaps 50a and 50b utilized as water passages between the shields 28 and the metal blocks 25 and 26. Further, the inner dimension and the height of the metal block 27 are made to be larger than those of the magnet 23 to form a gap 51 acting as a water passage between the shield 29, metal block 27 and magnet 23. According to this modification, since all of the magnet, metal blocks and shields which generate heat are directly in contact with water, the cooling effect is high. Moreover, as the upper surfaces and the side surfaces of the magnets 22, 23 are in contact with the cooling water, the magnets are efficiently cooled to stabilize its magnetic characteristics.

Figure 10:
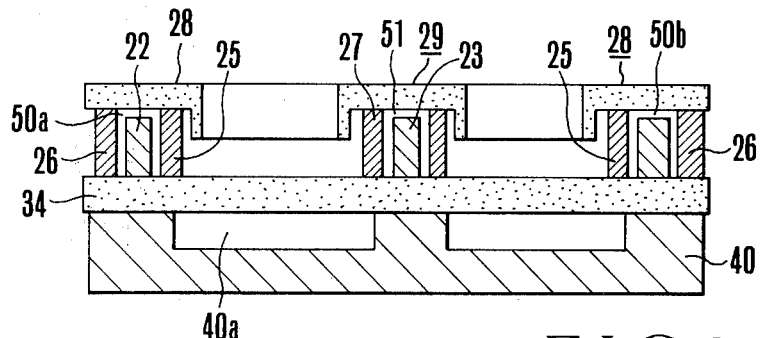

In the embodiment shown in FIG. 10 the yoke 40 shown in FIG. 6 is combined with the embodiment shown in FIG. 9 to combine the advantages of both embodiments.

It should be understood that many other modifications can be made within the scope of this invention.

The invention is not limited to various embodiments described above. For example, the shape and position of the metal blocks may be different from those shown in the drawings.

What is claimed is:

1. In sputtering apparatus of the type wherein a cathode including a target made of ferromagnetic material and a substrate to be sputtered are disposed in an evacuated vessel in a spaced opposing relationship so as to sputter said target with ions to form a thin magnetic film on said substrate, the improvement which comprises a magnet, a shield covering a surface of said magnet facing said substrate, said shield being made of the same or similar material as said target, a metal block disposed to surround said magnet and covered by said shield and a backing plate made of ferromagnetic material which supports the magnet, the block and the shield, and a passage for passing cooling water to cool the above components.

2. In sputtering apparatus of the type wherein a cathode includng a target made of ferromagnetic material and a substrate to be sputtered are disposed in an evacuated vessel in a spaced opposing relationship so as to sputter said target with ions to form a thin magnetic film on said substrate, the improvement which comprises a magnet, a shield covering a surface of said magnet facing said substrate, said shield being made of the same or similar material as said target, a metal block disposed to surround said magnet and covered by said shield, and backing plate made of ferromagnetic material which supports the magnet, the block and the shield.

3. The sputtering apparatus as defined in claim 1 wherein said metal block is made of a material selected from copper, aluminum, stainless steel and thin ferromagnetic material.

4. The sputtering apparatus as defined in claim 1 wherein said target is mounted on said backing plate.

5. The sputtering apparatus as defined in claim 1 wherein said target is embedded in said backing plate.

6. The sputtering apparatus as defined in claim 1 wherein said backing plate is served as the target.

7. The sputtering apparatus as defined in claim 1 wherein said passage for passing cooling water is formed in said metal block.

8. The sputtering apparatus as defined in claim 1 which further comprises a yoke made of soft ferromagnetic material and disposed in parallel with said target, said yoke forming a magnetic circuit together with said magnet.

9. The sputtering apparatus as defined in claim 8 wherein said yoke has an E shaped sectional configuration, said magnet comprises at least two magnet members, one of the magnet members opposes to a central projection of said yoke, while the other magnet members opposing projections on the opposite ends of said yoke takes the form of an annulars.

10. The sputtering apparatus as defined in claim 9 wherein said passage for passing cooling water is formed at each of spaces between said projections.

11. The sputtering apparatus as defined in claim 1 wherein said shield is provided with a passage for passing cooling water.

12. The sputtering apparatus as defined in claim 1 wherein said magnet has smaller height than said metal block so as to define said cooling water passage between said shield, said magnet and said metal block.

* * * * *